(12) United States Patent
Shoji (10) Patent No.: US 7,394,240 B2
(45) Date of Patent: Jul. 1, 2008

(54) CURRENT SENSOR

(75) Inventor: Shigeru Shoji, Tokyo (JP)

(73) Assignee: TDK Corporation, Tokyo (JP)

( * ) Notice: Subject to any disclaimer, the term of this patent is extended or adjusted under 35 U.S.C. 154(b) by 127 days.

(21) Appl. No.: 11/223,934

(22) Filed: Sep. 13, 2005

(65) Prior Publication Data

US 2006/0071655 A1 Apr. 6, 2006

(30) Foreign Application Priority Data

Oct. 1, 2004 (JP) ............................. 2004-290596

(51) Int. Cl.
*G01R 7/00* (2006.01)
(52) U.S. Cl. .................................................... 324/142
(58) Field of Classification Search ................... None
See application file for complete search history.

(56) References Cited

U.S. PATENT DOCUMENTS

| 4,464,625 | A  | * | 8/1984  | Lienhard et al.  | 324/117 R |
| 5,218,279 | A  | * | 6/1993  | Takahashi et al. | 324/117 H |
| 5,500,590 | A  | * | 3/1996  | Pant             | 324/252   |
| 5,621,377 | A  |   | 4/1997  | Dettmann et al.  |           |
| 5,933,003 | A  |   | 8/1999  | Hebing et al.    |           |
| 6,329,818 | B1 | * | 12/2001 | Tokunaga et al.  | 324/252   |
| 6,984,989 | B2 | * | 1/2006  | Kudo et al.      | 324/529   |
| 7,023,724 | B2 | * | 4/2006  | Katti            | 365/158   |
| 7,085,116 | B2 | * | 8/2006  | Kudo et al.      | 361/93.6  |
| 7,157,898 | B2 | * | 1/2007  | Hastings et al.  | 324/117 R |
| 7,164,263 | B2 | * | 1/2007  | Yakymyshyn et al. | 324/117 R |
| 2003/0117254 | A1 | * | 6/2003 | Wan et al.       | 338/32 R  |
| 2004/0095126 | A1 | * | 5/2004 | Kudo et al.      | 324/117 R |
| 2005/0156587 | A1 | * | 7/2005 | Yakymyshyn et al. | 324/117 R |
| 2005/0185346 | A1 | * | 8/2005 | Shoji            | 360/324.1 |
| 2006/0255793 | A1 | * | 11/2006 | Montreuil       | 324/117 R |
| 2006/0291106 | A1 | * | 12/2006 | Shoji           | 360/324.11 |
| 2007/0076332 | A1 | * | 4/2007  | Shoji et al.     | 360/324.12 |
| 2007/0090825 | A1 | * | 4/2007  | Shoji            | 324/117 R |
| 2007/0096716 | A1 | * | 5/2007  | Shoji            | 324/117 H |
| 2007/0188946 | A1 | * | 8/2007  | Shoji            | 360/324.12 |
| 2007/0230070 | A1 | * | 10/2007 | Mizuno et al.    | 360/324.12 |

FOREIGN PATENT DOCUMENTS

| JP | A-766033       | 3/1995 |
| JP | A-8-70148      | 3/1996 |
| JP | A-09-127161    | 5/1997 |
| JP | A-2001-56908   | 2/2001 |
| WO | WO 2004/072672 A1 | 8/2004 |

* cited by examiner

*Primary Examiner*—Jermele M Hollington
(74) *Attorney, Agent, or Firm*—Oliff & Berridge, PLC (57) ABSTRACT

The present invention provides a current sensor capable of adjusting an offset value at a zero magnetic field more easily and detecting a current magnetic field generated by a current to be detected with high sensitivity and high precision. The current sensor has: first and second magnetoresistive elements disposed along a conductor so that resistance values change in directions opposite to each other in accordance with a current magnetic field generated by a current to be detected flowing in the conductor; and
first and second constant current sources that supply constant currents equal to each other to the first and second magnetoresistive elements, respectively. The current sensor further includes a differential amplifier that detects the difference between voltage drops occurring in the first and second magnetoresistive elements by the constant current. The current to be detected is detected on the basis of the difference between the voltage drops.

12 Claims, 4 Drawing Sheets

CURRENT SENSOR

BACKGROUND OF THE INVENTION

1. Field of the Invention

The present invention relates to a small-sized current sensor capable of sensing a change in current flowing in a conductor with high sensitivity.

2. Description of the Related Art

One of general methods of measuring control current for controlling control equipment or the like is a method of indirectly measuring control current by detecting the gradient of a current magnetic field generated by the control current. A concrete example is a method of forming a Wheatstone bridge by using four magnetoresistive elements such as giant magnetoresistive elements (hereinbelow, GMR elements) producing giant magnetoresistive effect, disposing the Wheatstone bridge in the current magnetic field, and detecting the gradient of the current magnetic field (refer to, for example, U.S. Pat. No. 5,621,377).

By forming the Wheatstone bridge as described above, noise (interfering magnetic field) from the outside and the influence of the environment temperature can be suppressed to be relatively low. In particular, in the case where characteristics of the four magnetoresistive elements are uniform, a stabler detection characteristic can be obtained.

Another method of further reducing a change in output voltage caused by the environment temperature or noise from the outside by providing a compensating current line is also disclosed (refer to, for example, U.S. Pat. No. 5,933,003).

Recently, because of increasing necessity of detecting weaker current, a magnetoresistive element having a higher impedance and higher sensitivity is being demanded. However, when a Wheatstone bridge is formed by using such a magnetoresistive element having a higher impedance and higher sensitivity, a larger offset is generated and the influence of a variation in connection resistance or the like increases. In many cases, it becomes therefore difficult to adjust the balance of the four magnetoresistive elements.

SUMMARY OF THE INVENTION

The present invention has been achieved in consideration of such problems and an object of the invention is to provide a current sensor capable of adjusting an offset value at a zero magnetic field more easily and detecting a current magnetic field generated by a current to be detected with high sensitivity and high precision.

A current sensor of the invention includes: first and second magnetoresistive elements disposed along a conductor so that resistance values change in directions opposite to each other in accordance with a current magnetic field generated by a current to be detected flowing in the conductor; first and second constant current sources that supply constant currents of values equal to each other to the first and second magnetoresistive elements, respectively; and a differential detector that detects the difference between voltage drops occurring in the first and second magnetoresistive elements by the constant currents, wherein the current to be detected is detected on the basis of the difference between the voltage drops.

In the current sensor of the invention, the circuit is constructed by using two magnetoresistive elements. Consequently, balance can be adjusted more easily and it is easier to reduce the offset value at the zero magnetic field. Further, equal currents are passed to the first and second magnetoresistive elements by the first and second constant current sources which are equal to each other. Thus, without being influenced by variations in circuit impedances connected to the first and second magnetoresistive elements, an output voltage based on the difference between resistance values of the first and second magnetoresistive elements is obtained more easily.

Preferably, the current sensor of the invention further includes a compensating current line through which a compensating current according to the difference between the voltage drops flows, thereby applying compensating current magnetic fields in directions opposite to those of the current magnetic fields applied to the first and second magnetoresistive elements on the basis of the current to be detected to the first and second magnetoresistive elements. In this case, it is preferable to detect the current to be detected on the basis of the compensating current flowing in the compensating current line.

In the current sensor of the invention, the first and second magnetoresistive elements are disposed line-symmetrically with respect to a center line passing through a center point on a virtual straight line connecting the first and second magnetoresistive elements as a symmetry axis and extend in the same direction as the extending direction of the center line, and the conductor includes a U-shaped portion having a pair of parallel parts which extend in parallel with each other and are disposed line-symmetrically with respect to the center line as a symmetry axis. More strictly, it is preferable that magnetosensitive parts in the first and second magnetoresistive elements be disposed symmetrically with respect to the center line as a symmetry axis. In this case, the compensating current line has an inverted U shape in correspondence to the U-shaped portion of the conductor. The U-shape portion includes a pair of parallel parts and a folded part connecting the parallel parts. The inverted U shape is a shape obtained by inverting the U shape. Further, the folded part connecting the pair of parallel parts is not limited to a curved portion but may include one or more bent portions. "Parallel" denotes a strict parallel state in terms of geometry (a state where the angle formed by two components is 0°) and also includes a state where the angle is deviated from 0° due to an error in manufacturing or the like.

In the current sensor of the invention, each of the first and second magnetoresistive elements may have a stacked body comprises: a pinned layer having a magnetization direction pinned in a predetermined direction; a free layer whose magnetization direction changes according to an external magnetic field, and becomes parallel to the magnetization direction of the pinned layer when the external magnetic field is zero; and an intermediate layer sandwiched between the pinned layer and the free layer. The free layer is a so-called magnetosensitive part. In this case, the free layer may have an easy axis of magnetization parallel to the magnetization direction of the pinned layer. More preferably, the current sensor is provided with bias applying means for applying a bias magnetic field to each stacked body if the first and second magnetoresistive elements in a direction orthogonal to the magnetization direction of the pinned layer. As the bias applying means, either a permanent magnet or a bias current line extending in the magnetization direction of the pinned layer can be used.

In the current sensor of the invention, preferably, the first and second magnetoresistive elements are disposed so that the magnetization directions of the pinned layers in the first and second magnetoresistive elements are parallel to each other. Further, preferably, the first magnetoresistive element and the first constant current source are disposed on a straight line extending in the magnetization direction of the pinned layer in the first magnetoresistive element, and the second magnetoresistive element and the second constant current source are disposed on a straight line extending in the magnetization direction of the pinned layer in the second magnetoresistive element.

The current sensor of the invention includes: first and second magnetoresistive elements disposed along a conductor so that resistance values change in directions opposite to each other in accordance with a current magnetic field generated by a current to be detected flowing in the conductor; first and second constant current sources that supply constant currents of values equal to each other to the first and second magnetoresistive elements, respectively; and a differential detector that detects the difference between voltage drops occurring in the first and second magnetoresistive elements by the constant current, and the current to be detected is detected on the basis of the difference between the voltage drops. With the configuration, an offset value at the zero magnetic field can be adjusted more easily as compared with the case using four magnetoresistive elements, and the first and second magnetoresistive elements having higher sensitivity can be used. Further, stable currents which are equal to each other can be supplied to the first and second magnetoresistive elements. Therefore, a current magnetic field generated even by a weak current to be detected can be detected with high sensitivity and high precision.

In particular, in the case where the current sensor further includes a compensating current line through which a compensating current according to the difference between the voltage drops flows, thereby applying compensating current magnetic fields in directions opposite to those of the current magnetic fields applied to the first and second magnetoresistive elements on the basis of the current to be detected to the first and second magnetoresistive elements, a change in output voltage caused by variations in characteristics between the first and second magnetoresistive elements, variations in connection resistance in the circuit, or a temperature distribution can be cancelled. Thus, the current magnetic field generated by the current to be detected can be detected with higher sensitivity and higher precision.

Other and further objects, features and advantages of the invention will appear more fully from the following description.

DETAILED DESCRIPTION OF THE PREFERRED EMBODIMENTS

An embodiment of the invention will be described in detail hereinbelow with reference to the drawings.

Figure 1:
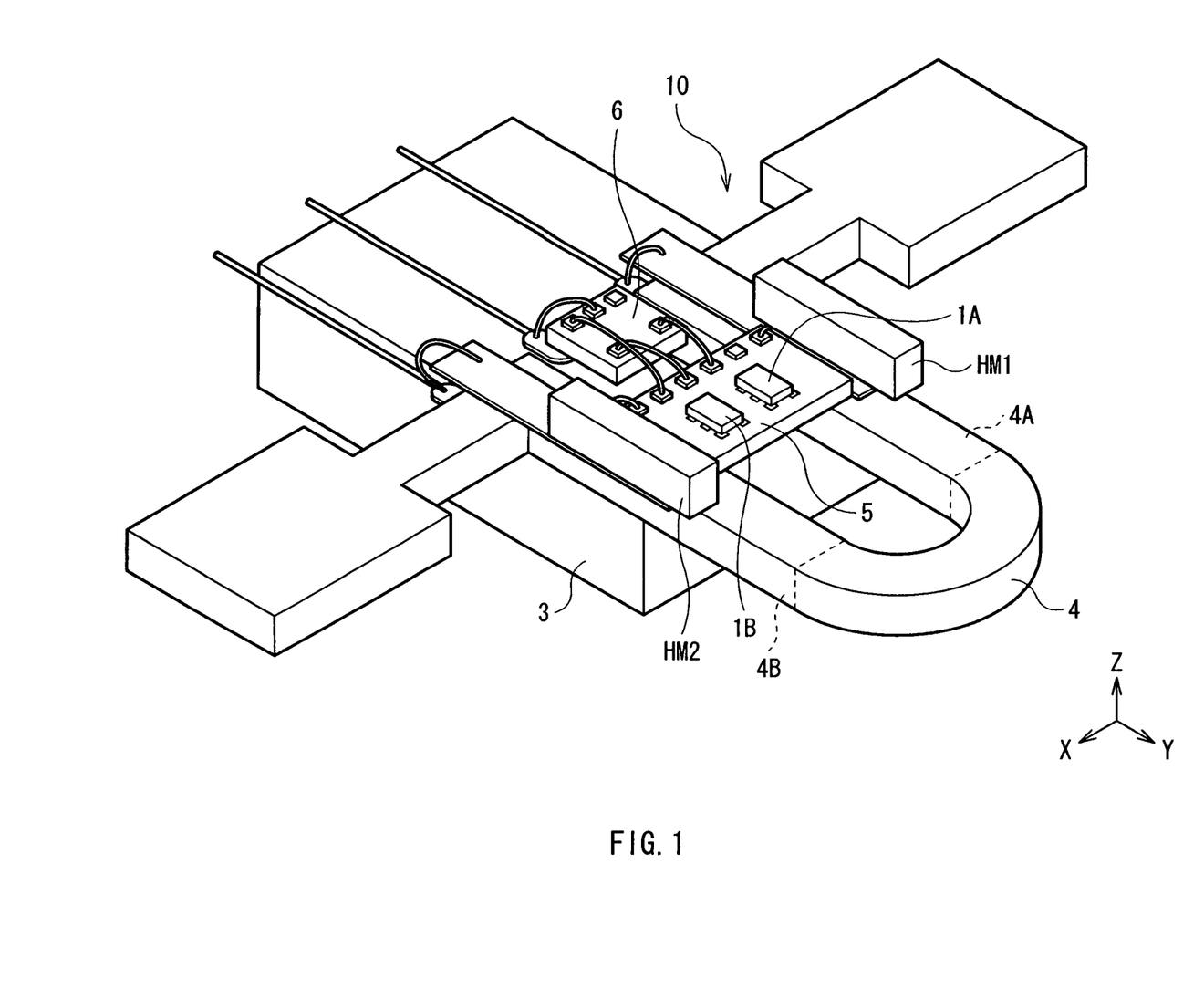
FIG. 1 is a perspective view showing the configuration of a current sensor according to an embodiment of the invention.
Figure 2:
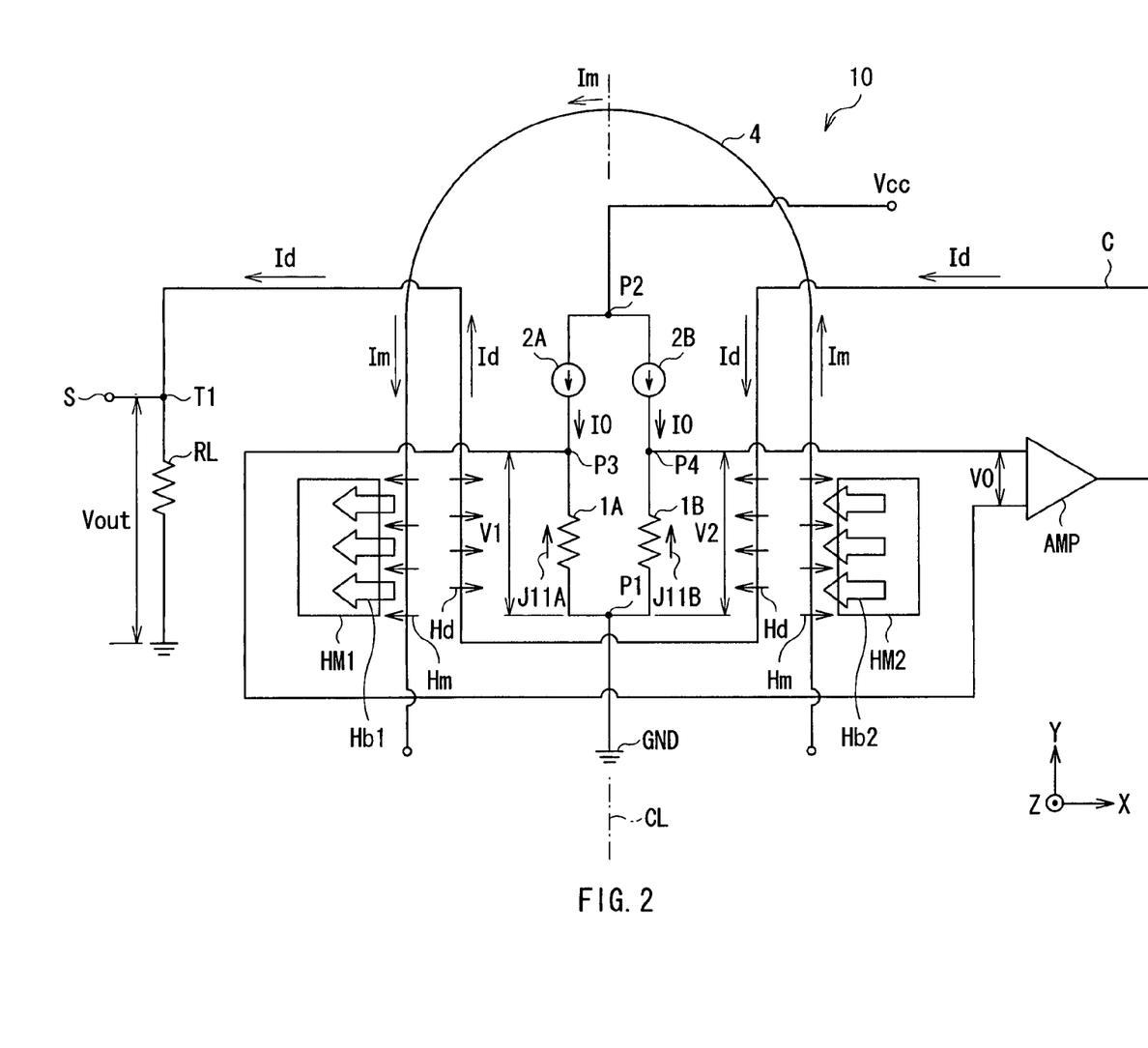
FIG. 2 is a circuit diagram of the current sensor shown in FIG. 1.

First, the configuration of a current sensor as an embodiment of the invention will be described with reference to FIGS. 1 and 2. FIG. 1 is a schematic view illustrating a perspective configuration of a current sensor 10 according to the embodiment. FIG. 2 shows a circuit configuration of the current sensor 10 illustrated in FIG. 1. All of arrows of a current Im to be detected, a compensating current Id, a current magnetic field Hm, a compensating current magnetic field Hd, bias magnetic fields Hb1 and Hb2, and a current I0 (all described later) show directions relative to first and second magnetoresistive elements.

The current sensor 10 is an ammeter for measuring the current Im to be detected supplied to a conductor 4 formed on a substrate 3, and has the first and second magnetoresistive elements 1A and 1B connected to each other at a first connection point P1 (hereinbelow, simply called the magnetoresistive elements 1A and 1B). The magnetoresistive elements 1A and 1B are disposed line-symmetrically with respect to a center line CL as an axis of symmetry passing through an intermediate point on a virtual straight line connecting the magnetoresistive elements 1A and 1B and extend along the center line CL (Y-axis direction in the diagram). The conductor 4 includes a U-shaped portion having a pair of parallel parts 4A and 4B. The parallel parts 4A and 4B of the pair are disposed in line symmetry with respect to the center line CL as an axis of symmetry in a plane parallel with a plane including the magnetoresistive elements 1A and 1B, and extend in parallel with each other along the center line CL. As a result, as shown by the arrows in FIG. 2, the current magnetic field Hm generated by the current Im to be detected is applied in the −X direction to the magnetoresistive element 1A and is applied in the +X direction to the magnetoresistive element 1B. Specifically, the magnetoresistive elements 1A and 1B are disposed so that the current magnetic fields Hm make resistance values R1 and R2 of the magnetoresistive elements 1A and 1B change in the directions opposite to each other due to the current magnetic fields Hm at the time of driving of the current sensor 10. Moreover, the distance from the parallel part 4A to the magnetoresistive element 1A is equal to that from the parallel part 4B to the magnetoresistive element 1B in the conductor 4, so that absolute values of the current magnetic fields Hm applied to the magnetoresistive elements 1A and 1B are equal to each other. Both of the magnetoresistive elements 1A and 1B are formed on a circuit board 5.

The current sensor 10 also has a constant current source 2A (first constant current source) and a constant current source 2B (second constant current source) whose one ends are connected to each other at a second connection point P2. The constant current source 2A is connected to an end on the side opposite to the first connection point P1 in the magnetoresistive element 1A at a third connection point P3. The other constant current source 2B is connected to an end on the side opposite to the first connection point P1 in the magnetoresistive element 1B at a fourth connection point P4. More concretely, the magnetoresistive element 1A and the constant current source 2A are connected to each other in series along the center line CL, and the magnetoresistive element 1B and the constant current source 2B are connected to each other in series along the center line CL. Both of them are disposed so as to align in the direction (X axis direction) orthogonal to the center line CL and consequently connected in parallel with each other. The constant current sources 2A and 2B are constructed so as to supply the constant currents I0 whose values are equal to each other to the magnetoresistive elements 1A and 1B. The constant current sources 2A and 2B are formed in a circuit board 6 provided over the substrate 3.

Near the magnetoresistive elements 1A and 1B, permanent magnets HM1 and HM2 are disposed as bias applying means for applying bias magnetic fields Hb1 and Hb2 in the −X direction to the magnetoresistive elements 1A and 1B. Moreover, the current sensor 10 has a compensating current line C, and the compensating current Id based on a potential difference between the third connection point P3 and the fourth connection point P4 when a voltage is applied across the first and second connection points P1 and P2 is applied to the compensating current line C. The input side of the compensating current line C is connected to the output side of a differential amplifier AMP as a differential detector connected to the second and third connection points P2 and P3, and the other end is grounded via a resistor RL. On the side of the differential amplifier AMP in the resistor RL, a compensating current detecting means S is connected at a connection point T1. The compensating current line C is constructed so that the compensating current Id gives the compensating current magnetic fields Hd to the magnetoresistive elements 1A and 1B. The direction of the compensating current magnetic field Hd is opposite to that of the current magnetic field Hm generated by the current Im to be detected. That is, the compensating current magnetic fields Hd generated by the current Im to be detected are applied, as shown by arrows in FIG. 2, in the +X direction to the magnetoresistive element 1A and in the −X direction to the magnetoresistive element 1B.

Figure 3:
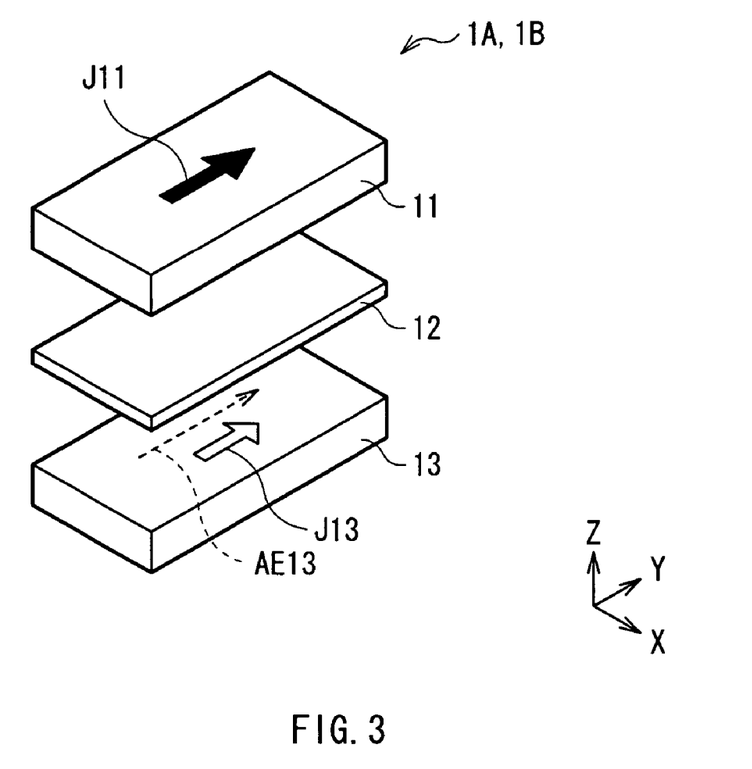
FIG. 3 is an exploded perspective view showing the configuration of a magnetoresistive element as a main part of the current sensor illustrated in FIG. 2.

Next, with reference to FIG. 3, the configuration of the magnetoresistive elements 1A and 1B will be described more specifically. FIG. 3 is an exploded perspective view showing the exploded configuration of the magnetoresistive elements 1A and 1B.

As shown in FIG. 3, the magnetoresistive elements 1A and 1B are GMR elements each having a spin valve structure in which a plurality of function films including magnetic layers are stacked. Each of the magnetoresistive elements 1A and 1B includes a pinned layer 11 having a magnetization direction J11 pinned in a direction (the +Y direction in the diagram) along the center line CL, a free layer 13 whose magnetization direction changes according to external magnetic fields H such as the current magnetic fields, and an intermediate layer 12 which is sandwiched between the pinned layer 11 and the free layer 13 and does not show any specific magnetization direction. The free layer 13 is made of a soft magnetic material such as nickel iron alloy (NiFe). The intermediate layer 12 is made of copper (Cu), whose top face is in contact with the pinned layer 11 and whose bottom face is in contact with the free layer 13. The intermediate layer 12 can be made of not only copper but also a nonmagnetic metal having high electric conductivity such as gold (Au). Each of the top face of the pinned layer 11 (the face on the side opposite to the intermediate layer 12) and the under face of the free layer 13 (the face on the side opposite to the intermediate layer 12) is protected with a not-shown protection film. Between the pinned layer 11 and the free layer 13, exchange bias magnetic fields Hin in the magnetization direction J11 (hereinbelow, simply called "exchange bias magnetic fields Hin") are generated and act each other via the intermediate layer 12. The strength of the exchange bias magnetic field Hin changes as a spin direction in the free layer 13 rotates according to the interval between the pinned layer 11 and the free layer 13 (that is, the thickness of the intermediate layer 12). Although FIG. 3 shows a configuration example of the case where the free layer 13, the intermediate layer 12, and the pinned layer 11 are stacked in order from the bottom, the invention is not limited to the configuration. The layers may be stacked in the opposite order.

Figure 4:
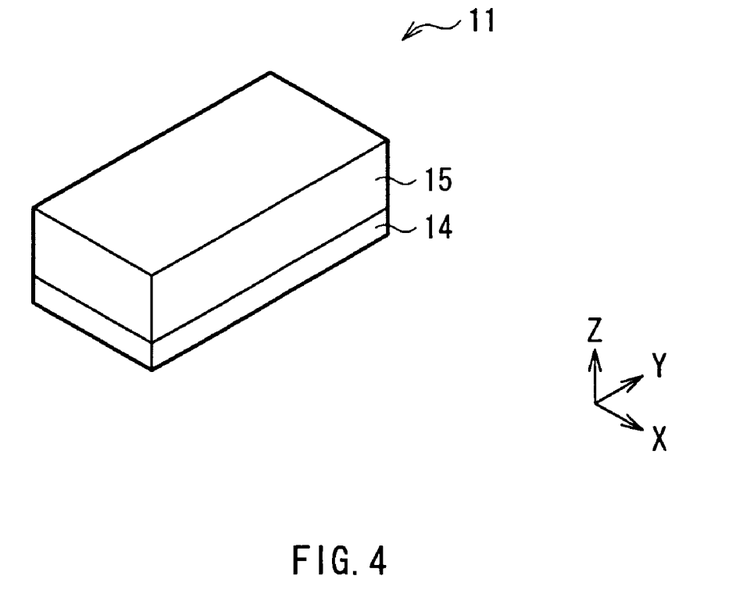
FIG. 4 is a perspective view showing the configuration of a part in the magnetoresistive element illustrated in FIG. 3.

FIG. 4 shows a detailed configuration of the pinned layer 11. The pinned layer 11 has a configuration in which a magnetization pinned layer 14 and an antiferromagnetic film 15 are stacked from the side of the intermediate layer 12. The magnetization pinned layer 14 is made of ferromagnetic material such as cobalt (Co) or cobalt iron alloy (CoFe). The magnetization direction of the magnetization pinned layer 14 is the magnetization direction J11 of the pinned layer 11 as a whole. The antiferromagnetic film 15 is made of antiferromagnetic material such as platinum manganese alloy (PtMn) or iridium manganese alloy (IrMn). The antiferromagnetic film 15 is in the state where the spin magnetic moment in the +Y direction and that in the opposite direction (−Y direction) completely cancel out each other, and functions so as to pin the magnetization direction J11 of the magnetization pinned layer 14.

In the first and second magnetoresistive elements 1A and 1B constructed as described above, by application of the current magnetic field Hm, the magnetization direction J13 of the free layer 13 rotates, thereby changing a relative angle between the magnetization directions J13 and J11. The relative angle is determined according to the magnitude or direction of the current magnetic field Hm.

Figure 5:
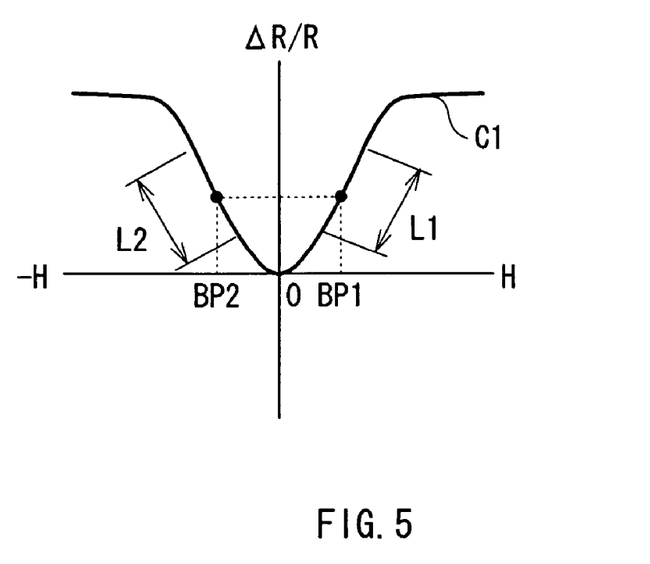
FIG. 5 is a characteristic diagram showing magnetic field dependence of resistance change rate in the magnetoresistive element illustrated in FIG. 3.

FIG. 3 shows a no load state where the current magnetic field Hm is zero (Hm=0) and the bias magnetic fields Hb1 and Hb2 generated by the permanent magnets HM1 and HM2 are not applied (that is, the state where the external magnetic field H is zero). Since an easy magnetization axis direction AE13 of the free layer 13 is set in parallel with the magnetization direction J11 of the pinned layer 11, all of the easy magnetization axis direction AE13, the magnetization direction J13, and the magnetization direction J11 are parallel to each other along the +Y direction in this state. Consequently, the spin directions of magnetic domains in the free layer 13 align in almost the same direction. In the case where the external magnetic field H is applied to the magnetoresistive elements 1A and 1B in the direction orthogonal to the magnetization direction J11 (+X direction or −X direction), a characteristic shown in FIG. 5 is obtained. FIG. 5 shows the relation between the external magnetic field H and the rate ΔR/R of resistance when the external magnetic field H in the +X direction is assumed to be positive. The relation is the smallest (ΔR/R=0) when the external magnetic field H is zero (H=0), and is expressed by a curve C1 which hardly shows hysteresis. In this case, 1/f noise caused by hysteresis is extremely small, so that high-sensitive and stable sensing can be performed.

Figure 6:
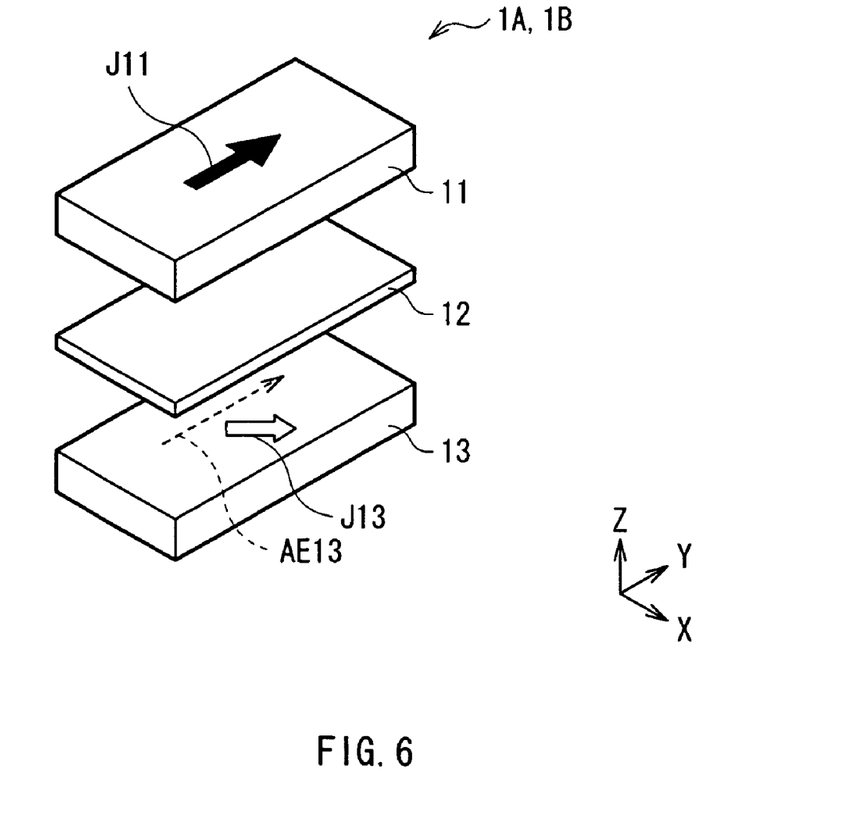
FIG. 6 is another exploded perspective view showing the configuration of the magnetoresistive element as a main part of the current sensor illustrated in FIG. 2.

As is evident from FIG. 5, however, a linear change cannot be obtained in a range around zero of the external magnetic field H. Therefore, in the case of actually measuring the current magnetic field Hm, the bias magnetic fields Hb1 and Hb2 generated by the permanent magnets HM1 and HM2 are applied in a direction orthogonal to the magnetization direction J11 and, as shown in FIG. 6, the magnetization direction J13 is turned to be slightly tilted so as to include a component in the +X direction or a component in the −X direction (FIG. 6 shows the case where the magnetization direction J13 is tilted to the +X direction). In such a manner, in linear areas L1 and L2 whose centers are bias points BP1 and BP2, respectively, shown in FIG. 5, a change in the current magnetic field Hm can be detected with high precision. In the current sensor 10, since the magnetization directions J11 of the magnetoresistive elements 1A and 1B in the pinned layer 11 are the same direction (+Y direction), the bias magnetic fields Hb1 and Hb2 in the same direction (−X direction in FIG. 2) are applied to both of the magnetoresistive elements 1A and 1B. Consequently, when the current magnetic field Hm is detected, the resistance value R1 of the magnetoresistive element 1A and the resistance value R2 of the magnetoresistive element 1B change in directions opposite to each other. For example, a bias magnetic field having strength corresponding to the bias point BP1 (refer to FIG. 5) is preliminarily applied in the +X direction to the magnetoresistive elements 1A and 1B. When the current Im to be detected is passed as shown in FIG. 2, the current magnetic field Hm in the −X direction is applied to the magnetoresistive element 1A. Consequently, as is evident from FIG. 5, the rate of resistance decreases (the resistance value R1 decreases). In contrast, when the current magnetic field Hm in the +X direction is applied to the magnetoresistive element 1B, as is obvious from FIG. 5, the rate of resistance increases (the resistance value R2 increases).

In the current sensor 10 having such a configuration, the compensating current Id based on the potential difference V0 between the third and fourth connection points P3 and P4 (the difference between voltage drops occurring in the magnetoresistive elements 1A and 1B) when voltage is applied across the first and second connection points P1 and P2 flows in the compensating current line C via the differential amplifier AMP as a differential detector. The compensating current Id is detected by compensating current detecting means S. The differential amplifier AMP adjusts the compensating current Id so that the difference V0 becomes zero.

A method of measuring the current magnetic field Hm generated by the current Im to be detected will be described hereinbelow with reference to FIG. 2.

In FIG. 2, constant currents from the constant current sources 2A and 2B when a predetermined voltage is applied across the first and second connection points P1 and P2 are expressed as I0, and the resistance values of the magnetoresistive elements 1A and 1B are expressed as R1 and R2, respectively. In the case where no current magnetic field Hm is applied, the potential V1 at the third connection point is expressed as follows.

$$V1 = I0 \cdot R1$$

The potential V2 at the fourth connection point P4 is expressed as follows.

$$V2 = I0 \cdot R2$$

Therefore, the potential difference between the third and fourth connection points P3 and P4 is obtained by the following equation.

$$V0 = V1 - V2 \quad (1)$$
$$= I0 \cdot R1 - I0 \cdot R2$$
$$= I0 \cdot (R1 - R2)$$

In this circuit, by measuring the potential difference V0 when the current magnetic field Hm is applied, the resistance change amount is obtained. For example, it is assumed that when the current magnetic field Hm is applied, the resistance values R1 and R2 increase only by change amounts ΔR1 and ΔR2, respectively, Equation (1) is changed as follows.

$$V0 = V1 - V2 \quad (2)$$
$$= I0 \cdot (R1 - R2)$$
$$= I0 \cdot \{(R1 + \Delta R1) - (R2 + \Delta R2)\}$$

As already described above, the magnetoresistive elements 1A and 1B are disposed so that the resistance values R1 and R2 change in directions opposite to each other in accordance with the current magnetic fields Hm. The signs (positive and negative signs) of the change amounts ΔR1 and ΔR2 are accordingly opposite to each other. Therefore, in Equation (2), while the resistance values R1 and R2 before application of the current magnetic fields Hm cancel out each other, the change amounts ΔR1 and ΔR2 are maintained as they are.

When it is assumed that the magnetoresistive elements 1A and 1B have the same characteristics, that is, R1=R2=R and ΔR1 =−ΔR2=ΔR, Equation (2) is changed as follows.

$$V0 = I0 \cdot (R1 + \Delta R1 - R2 \cdot \Delta R2) \quad (3)$$
$$= I0 \cdot (R + \Delta R - R + \Delta R)$$
$$= I0 \cdot (2\Delta R)$$

Therefore, by using the magnetoresistive elements 1A and 1B whose relations of the resistance change amounts with external magnetic fields are grasped in advance, the magnitude of the current magnetic field Hm can be measured, and the magnitude of the current Im to be detected which generates the current magnetic field Hm can be estimated. In this case, since sensing is performed by using the two magnetoresistive elements 1A and 1B, the resistance change amount twice as large as that of the case of performing sensing by using the magnetoresistive element 1A or 1B singly can be obtained. Thus, the invention is favorable for higher precision of a measurement value. In addition, variations in the characteristics among the magnetoresistive elements, variations in connection resistance, and the like can be suppressed more than the case of performing sensing using a bridge circuit constructed by four magnetoresistive elements. Therefore, even in the case of using high-sensitive magnetoresistive elements, balance adjustment is easy. Moreover, the number of magnetoresistive elements themselves can be also reduced and, accordingly, the number of terminals decreases, so that the invention is favorable for reduction in space.

Further, in the current sensor 10, both of the potential V1 detected at the third connection point P3 and the potential V2 detected at the fourth connection point P4 are supplied to the differential amplifier AMP, and the compensating current Id by which the difference (the potential difference V0) becomes zero is output. The compensating current Id from the differential amplifier AMP flows in the direction opposite to the current Im to be detected near the magnetoresistive elements 1A and 1B, and generates the compensating current magnetic fields Hd in the direction opposite to that of the current magnetic fields Hm, thereby acting so as to cancel an error caused by variations in the connection resistance in the circuit, variations in the characteristics between the magnetoresistive elements 1A and 1B, bias in the temperature distribution, an interfered magnetic field from the outside, or the like. As a result, the magnitude of the compensating current Id becomes proportional only to the current magnetic field Hm. Therefore, the compensating current detecting means S can compute the current magnetic field Hm more accurately by measuring the output voltage Vout and calculating the compensating current Id from the relation with the known resistor RL and, accordingly, can estimate the magnitude of the current Im to be detected with high precision.

As described above, the current sensor 10 of the embodiment has: the magnetoresistive elements 1A and 1B disposed along the conductor 4 so that resistance values R1 and R2 that change in directions opposite to each other in accordance with the current magnetic field Hm generated by the current Im to be detected flowing in the conductor 4, and connected in parallel with each other; the constant current source 2A connected in series with the magnetoresistive element 1A at the third connection point P3; and the constant current source 2B connected in series with the magnetoresistive element 1B at the fourth connection point P4. The constant current sources 2A and 2B are connected at the second connection point P2. The current Im to be detected is detected on the basis of the potential difference V0 between the third and fourth connection points P3 and P4 when voltage is applied across the first and second connection points P1 and P2. With the configuration, an offset value can be adjusted at the zero magnetic field more easily as compared with the case of using four magnetoresistive elements, and magnetoresistive elements having higher sensitivity can be used as the magnetoresistive elements 1A and 1B. Equal and stable currents can be supplied to the magnetoresistive elements 1A and 1B. Therefore, the current magnetic field Hm generated even by the weak current Im to be detected can be detected with high sensitivity and high precision. By providing the constant current sources 2A and 2B, adjustment of the balance between the magnetoresistive elements 1A and 1B becomes necessary but it can be electrically controlled. Consequently, as compared with the case of using four magnetoresistive elements, the balance can be adjusted more easily.

In particular, the current sensor 10 further includes the compensating current line C to which the compensating current Id according to the difference V0 between the potential V1 detected at the third connection point P3 and the potential V2 detected at the fourth connection point P4 (the difference between the voltage drops which occur in the magnetoresistive elements 1A and 1B) is supplied. The compensating current Id gives the compensating current magnetic field Hd in the direction opposite to that of the current magnetic field Hm to each of the magnetoresistive elements 1A and 1B. Therefore, a change in the output voltage Vout caused by variations in characteristics between the magnetoresistive elements, variations in connection resistance in the circuit, a temperature distribution, or the like can be cancelled. Thus, the current magnetic field Hm can be detected with higher sensitivity and higher precision.

Further, in the current sensor 10, the magnetoresistive elements 1A and 1B, the constant current sources 2A and 2B, and the compensating current line C are provided so as to be line-symmetrical with respect to the center line CL as a symmetry axis, and the pair of parallel parts 4A and 4B in the conductor 4 are disposed line-symmetrically with respect to the center line C as a symmetry axis in a plane parallel with a plane including the magnetoresistive elements 1A and 1B and extend in parallel with each other along the center line CL. Thus, a temperature distribution which is symmetrical with respect to the center line CL can be obtained. Therefore, a zero point drift depending on the temperature distribution can be suppressed.

Although the invention has been described by the embodiment, the invention is not limited to the embodiment but can be variously modified. For example, a permanent magnet is used as the bias applying means in the embodiment, but the invention is not limited to a permanent magnet. It is also possible to provide a bias current line extending in the magnetization direction of each of the pinned layers in the first and second magnetoresistive elements and generate a bias magnetic field by passing a predetermined current to the bias current line. The compensating current line may not to be provided. In this case, the bias applying means becomes unnecessary.

Further, in the embodiment, the first and second constant current sources are connected to each other at the second connection point. However, they may not be connected to each other but may be connected to different power source voltages.

Although the conductor has the U shape in the embodiment, the conductor is not limited to have the shape. For example, a shape obtained by connecting a pair of two lines via one straight line, a V shape, or an M shape can be used.

The current sensor of the invention is used for the purpose of measuring a current value itself and can be also applied to an eddy-current inspection technique for making an inspection for detecting a defect in printed wiring or the like. One of application examples is a current sensor in which a number of magnetoresistive elements are arranged on a straight line and a change in an eddy-current is detected as a change in a magnetic flux.

What is claimed is:

1. A current sensor comprising:
   first and second magnetoresistive elements disposed along a conductor so that resistance values change in directions opposite to each other in accordance with a current magnetic field generated by a current to be detected flowing in the conductor;
   first and second constant current sources that supply constant currents equal to each other to the first and second magnetoresistive elements, respectively; and
   a differential detector that detects a difference between voltage drops occurring in the first and second magnetoresistive elements by the constant currents,
   wherein the current to be detected is detected on the basis of the difference between the voltage drops.

2. A current sensor according to claim 1, wherein one end of the first magnetoresistive element and one end of the second magnetoresistive element are connected to each other at a first connection point,
   one end of the first constant current source and one end of the second constant current source are connected to each other at a second connection point,
   further, the other end of the first magnetoresistive element and the other end of the first constant current source are connected to each other at a third connection point, the other end of the second magnetoresistive element and the other end of the second constant current source are connected to each other at a fourth connection point, and
   the current to be detected is detected on the basis of a potential difference between the third and fourth connection points when voltage is applied across the first and second connection points.

3. A current sensor according to claim 1, wherein the first and second magnetoresistive elements are disposed line-symmetrically with respect to a center line passing through a center point on a virtual straight light connecting the first and second magnetoresistive elements as a symmetry axis and extend in the same direction as the extending direction of the center line, and
   the conductor includes a U-shaped portion having a pair of parallel parts which are disposed line-symmetrically with respect to the center line as a symmetry axis in a plane parallel with a plane including the first and second magnetoresistive elements and extend in parallel with each other along the center line.

4. A current sensor according to claim 1, further comprising a compensating current line through which a compensating current according to the difference between the voltage drops flows, thereby applying compensating current magnetic fields in directions opposite to those of the current magnetic fields applied to the first and second magnetoresistive elements on the basis of the current to be detected to the first and second magnetoresistive elements.

5. A current sensor according to claim 4, wherein the current to be detected is detected on the basis of the compensating current flowing in the compensating current line.

6. A current sensor according to claim 4, wherein the compensating current line has an inverted U shape in correspondence to the U-shaped portion of the conductor.

7. A current sensor according to claim 1, wherein each of the first and second magnetoresistive elements has a stacked body comprises:
 a pinned layer having a magnetization direction pinned in a predetermined direction;
 a free layer whose magnetization direction changes according to an external magnetic field, and becomes parallel to the magnetization direction of the pinned layer when the external magnetic field is zero; and
 an intermediate layer sandwiched between the pinned layer and the free layer.

8. A current sensor according to claim 7, wherein the free layer has an easy axis of magnetization parallel to the magnetization direction of the pinned layer.

9. A current sensor according to claim 7, further comprising bias applying means for applying a bias magnetic field in a direction orthogonal to the magnetization direction of the pinned layer for the stacked body.

10. A current sensor according to claim 9, wherein the bias applying means is either a permanent magnet or a bias current line extending in the magnetization direction of the pinned layer.

11. A current sensor according to claim 7, wherein the first and second magnetoresistive elements are disposed so that the magnetization directions of the pinned layers in the first and second magnetoresistive elements are parallel to each other.

12. A current sensor according to claim 11, wherein the first magnetoresistive element and the first constant current source are disposed on a straight line extending in the magnetization direction of the pinned layer in the first magnetoresistive element, and
 the second magnetoresistive element and the second constant current source are disposed on a straight line extending in the magnetization direction of the pinned layer in the second magnetoresistive element.

* * * * *